United States Patent
Perera et al.

(10) Patent No.: US 11,770,916 B2
(45) Date of Patent: Sep. 26, 2023

(54) APPARATUS FOR AN INDUCTOR DISPOSED IN A BAND FOR METHOD OF HEAT DISPERSION

(71) Applicant: Modular Power Technology, Inc., Sunnyvale, CA (US)

(72) Inventors: Dhammika L. Perera, San Jose, CA (US); John Weld, Ledgewood, NJ (US); Matthew Wilkowski, Rockwall, TX (US)

(73) Assignee: Modular Power Technoogy, Inc., Sunnyvale, CA (US)

( * ) Notice: Subject to any disclaimer, the term of this patent is extended or adjusted under 35 U.S.C. 154(b) by 0 days.

(21) Appl. No.: 17/687,381

(22) Filed: Mar. 4, 2022

(65) Prior Publication Data

US 2022/0272864 A1 Aug. 25, 2022

Related U.S. Application Data

(63) Continuation of application No. 17/495,190, filed on Oct. 6, 2021, now Pat. No. 11,317,545.

(60) Provisional application No. 63/105,567, filed on Oct. 26, 2020.

(51) Int. Cl.
| | |
|---|---|
| *H01F 27/28* | (2006.01) |
| *H05K 7/20* | (2006.01) |
| *H01F 27/22* | (2006.01) |
| *H02M 1/00* | (2006.01) |
| *H01L 27/02* | (2006.01) |
| *H01F 1/147* | (2006.01) |
| *H01F 1/34* | (2006.01) |
| *H01F 27/24* | (2006.01) |

(52) U.S. Cl.
CPC ............. *H05K 7/209* (2013.01); *H01F 1/147* (2013.01); *H01F 1/344* (2013.01); *H01F 27/22* (2013.01); *H01F 27/24* (2013.01); *H01F 27/2876* (2013.01); *H01L 27/0248* (2013.01); *H02M 1/0003* (2021.05); *H05K 2201/1003* (2013.01)

(58) Field of Classification Search
None
See application file for complete search history.

(56) References Cited

U.S. PATENT DOCUMENTS

| | | | |
|---|---|---|---|
| 6,878,909 B2 * | 4/2005 | Bergstrom | H05B 6/105 219/635 |
| 7,180,395 B2 | 2/2007 | Lotfi | |
| 7,256,674 B2 | 8/2007 | Lotfi | |
| 7,276,998 B2 | 10/2007 | Lotfi | |
| 7,426,780 B2 | 9/2008 | Lotfi | |
| 7,462,317 B2 | 12/2008 | Lotfi | |

(Continued)

FOREIGN PATENT DOCUMENTS

| | | |
|---|---|---|
| CN | 210325416 U | 4/2020 |
| CN | 111354547 A | 6/2020 |

OTHER PUBLICATIONS

International Search Report and Written Opinion dated Feb. 23, 2022 for International Application No. PCT/US2021/053783.

*Primary Examiner* — Courtney L Smith
(74) *Attorney, Agent, or Firm* — Womble Bond Dickinson (US) LLP

(57) ABSTRACT

Embodiments of the present disclosure include an apparatus having a band including a high thermally conductive material is disposed at least partially around an inductor.

13 Claims, 13 Drawing Sheets

(56) References Cited

U.S. PATENT DOCUMENTS

| | | | |
|---|---|---|---|
| 7,550,726 B2 * | 6/2009 | Ikushima | G01J 5/34 |
| | | | 374/E1.021 |
| 7,688,172 B2 | 3/2010 | Lotfi | |
| 8,043,544 B2 | 8/2011 | Lotfi | |
| 8,139,362 B2 | 3/2012 | Lotfi | |
| 8,153,473 B2 | 4/2012 | Lotfi | |
| 8,266,793 B2 | 9/2012 | Lotfi | |
| 8,339,802 B2 | 12/2012 | Lotfi | |
| 8,384,506 B2 | 2/2013 | Lotfi | |
| 8,528,190 B2 | 9/2013 | Lotfi | |
| 8,631,560 B2 | 1/2014 | Lotfi | |
| 8,701,272 B2 | 2/2014 | Lotfi | |
| 8,910,369 B2 * | 12/2014 | Herbsommer | H02M 3/003 |
| | | | 29/592.1 |
| 9,054,086 B2 | 6/2015 | Lotfi | |
| 9,553,081 B2 * | 1/2017 | Lotfi | H01L 27/088 |
| 9,711,279 B2 | 7/2017 | Todorov et al. | |
| 9,892,851 B2 | 2/2018 | Todorov et al. | |
| 10,304,615 B2 | 5/2019 | Lotfi | |
| 10,333,407 B2 | 6/2019 | Todorov et al. | |
| 10,918,166 B2 * | 2/2021 | Choi | A43C 9/00 |
| 2007/0075816 A1 * | 4/2007 | Lotfi | H01F 17/04 |
| | | | 336/200 |
| 2008/0017354 A1 * | 1/2008 | Neal | H01F 27/10 |
| | | | 310/43 |
| 2008/0179525 A1 | 7/2008 | Ikushima et al. | |
| 2013/0077250 A1 | 3/2013 | Herbsommer et al. | |
| 2015/0229186 A1 * | 8/2015 | Sauer | H02K 9/19 |
| | | | 165/104.28 |
| 2016/0203907 A1 * | 7/2016 | Handy | H01F 27/266 |
| | | | 29/605 |
| 2018/0366257 A1 * | 12/2018 | Ovando | H01F 27/327 |

* cited by examiner

APPARATUS FOR AN INDUCTOR DISPOSED IN A BAND FOR METHOD OF HEAT DISPERSION

CROSS-REFERENCE TO RELATED APPLICATIONS

This application is a continuation of U.S. patent application Ser. No. 17/495,190, filed on Oct. 6, 2021, which claims the benefit of U.S. Provisional Patent Application No. 63/105,567, filed on Oct. 26, 2020, the disclosure of which is incorporated herein by reference in its entirety.

TECHNICAL FIELD

Embodiments of the current invention relate generally to an apparatus and method for heat dispersion for an integrated circuit and, more particularly, to a power module apparatus comprised of an inductor and a band comprised of a high thermal material.

BACKGROUND

An integrated circuit (IC) is a nanoscale set of electronic circuits on one small, flat piece of semiconductor material. There are many benefits of a smaller manufacturing and footprint size, such as increased processing speed and lower manufacturing costs. To maximize these benefits, there has been a large push for IC miniaturization. Since 1970, electronic circuits have shrunk in size from 10 micrometers to a current size of 10 nanometers. There are current efforts to make ICs even smaller.

While there are many benefits in decreasing the size, miniaturization increases power consumption and requires integrating heat dissipation methods and components to make a heat path away from the IC. To assist with the problems of heat dissipation and power management, an inductor is coupled to the IC. The incorporation of an inductor coupled to the IC creates a power module, which is necessary to protect voltage regulation, battery management, and power conversion efficiency of the IC.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Typically, integrated circuit (IC) layouts stack components side by side on a substrate, such as a lead frame or multilayer board. This is known as a two-dimensional (2D) package. A 2D package is ideal for heat dispersion, since the heat generated from the IC has an uninterrupted heat path to either the top or bottom of the package. To make smaller footprints, however, designers have started to vertically stack the components, known as a three-dimensional (3D) package. When stacking the components vertically, problems may occur. For example, if the inductor is stacked over the IC, then the heat path is interrupted to the dissipate at the top of the package. If the IC is stacked over the inductor, then the interconnects to the IC are harder to reach and more complicated to connect.

Aspects of the present disclosure address the above-noted and other deficiencies by providing an apparatus and method for power management and heat dissipation caused by the miniaturization of ICs and the vertical stacking of components. The IC chip may include a television interface adapter (TIA), one or more application specific integrated circuits (ASICs), a processing device, such as a computer processing unit (CPU), graphic processing unit (GPU), digital signal processor, field programmable gate array (FPGA), metal-oxide-semiconductor field-effect transistors (MOSFETs), Gallium Nitride (GaN) transistors (both N and P type), or any other types of processing devices or circuits. In some embodiments, the power module described herein may be an inductor structure with a high thermally conductive band partially disposed around the inductor structure, vertically stacked over an IC. In embodiments, the inductor structure may be a two-inductor that can function as either two separate non-coupled inductors or as a coupled inductor.

Figure 1A:
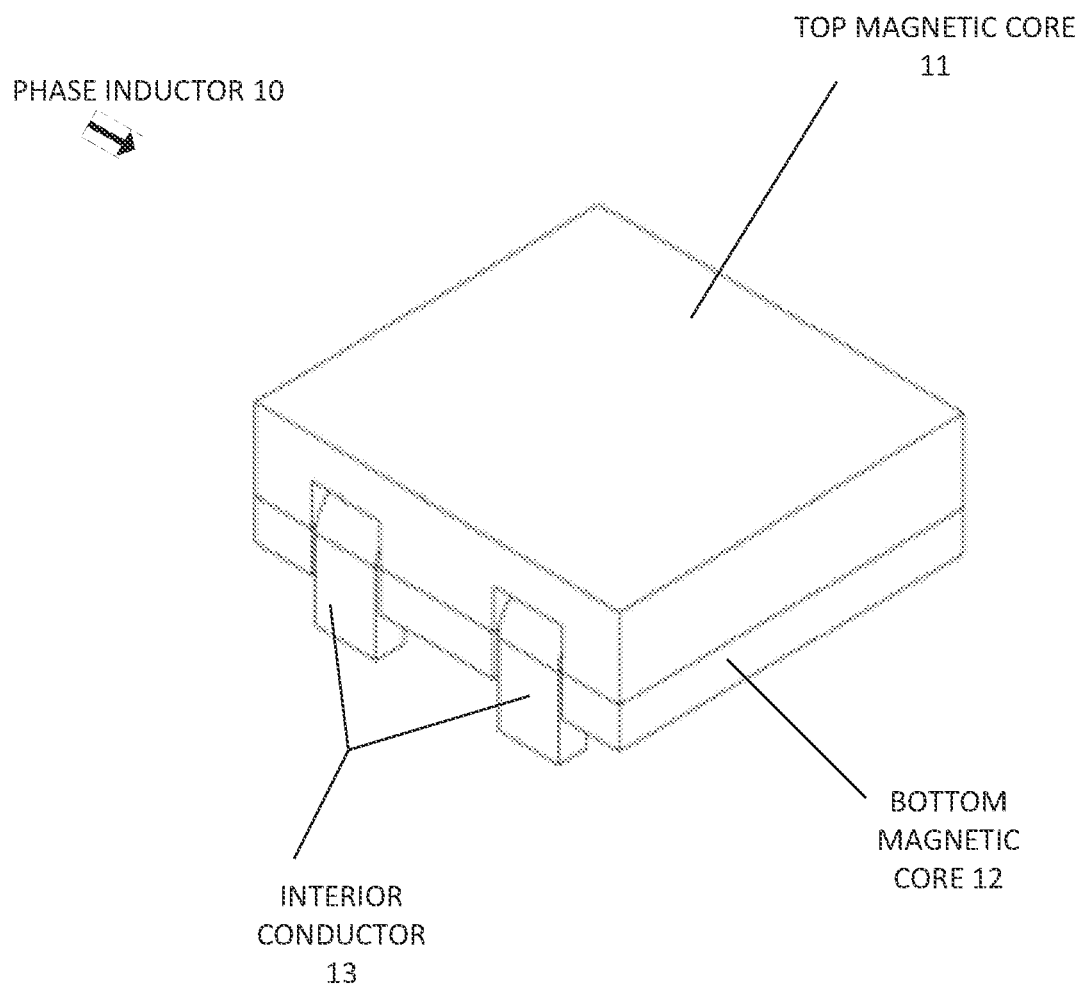
FIG. 1A illustrates an inductor structure for two-phase applications.
Figure 1B:
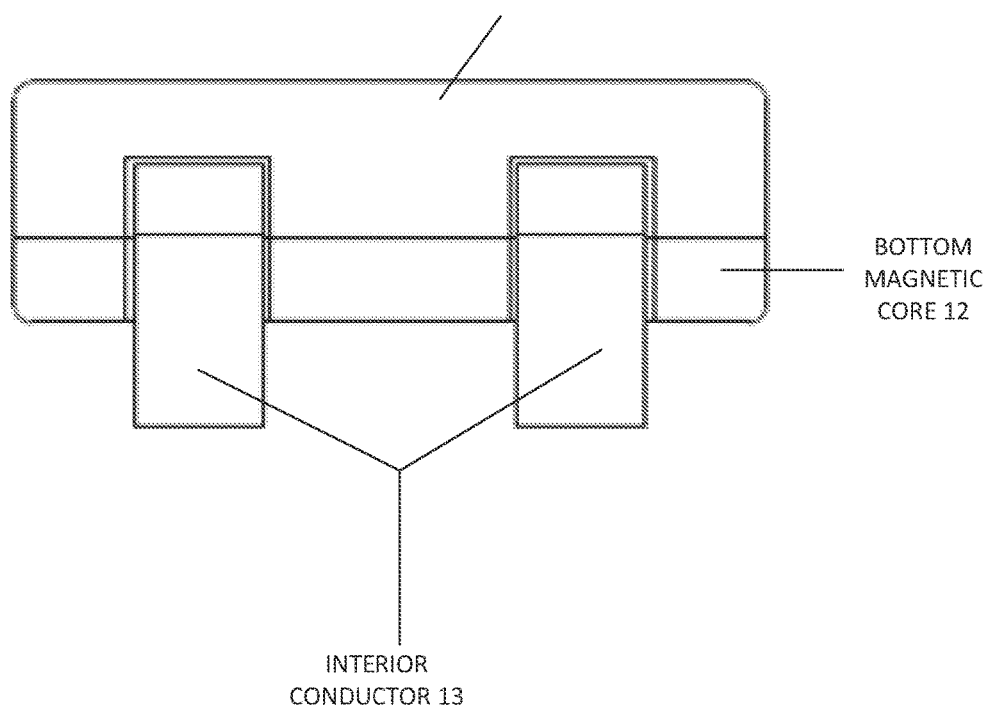
FIG. 1B depicts the front and back view of the inductor structure for two-phase applications in FIG. 1A, in accordance with some embodiments of the current disclosure.

FIG. 1A illustrates an inductor 10 for two-phase applications according to example implementations of the present disclosure. The inductor 10 may include one or more of each number of components depicted in FIG. 1A. The inductor 10 includes a top magnetic core 11 and a bottom magnetic core 12 with two separate openings with a single turn internal conductor 13 passing through each opening as is shown in further detail at FIG. 1B. In some embodiments, the top magnetic core 11 and the bottom magnetic core 12 may be formed of the same material. In embodiments, the top magnetic core 11 and the bottom magnetic core 12 may be formed of different materials.

Figure 1C:
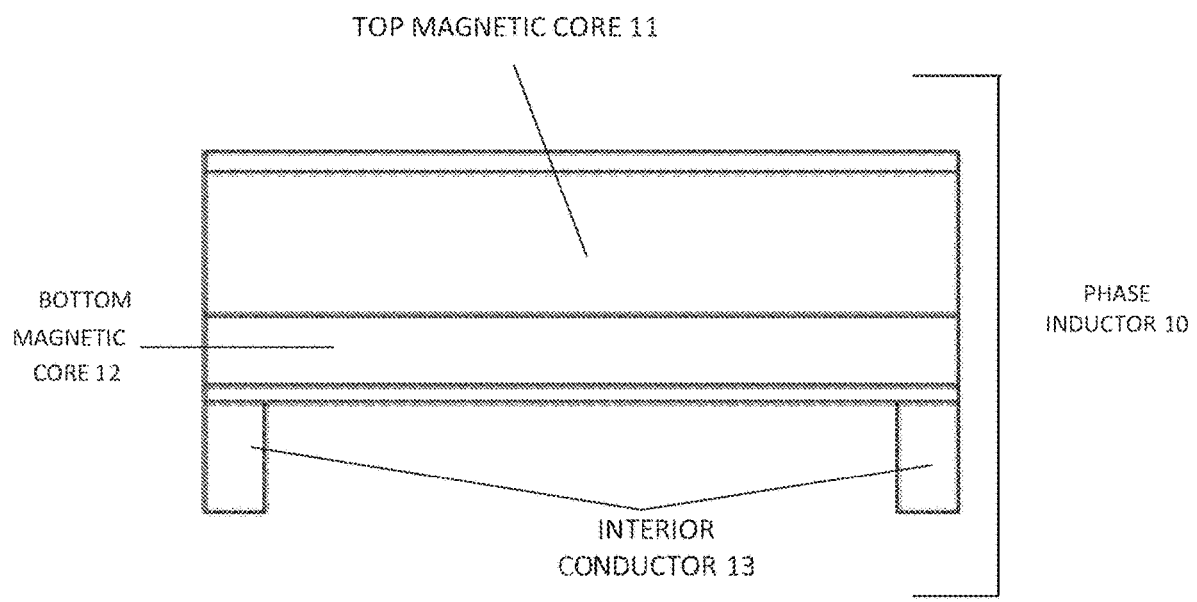
FIG. 1C depicts the side-view of the inductor structure for two-phase applications in FIG. 1A, in accordance to some embodiments of the current disclosure.

In an embodiment, the conductors 13 forming the single turn of each individual inductor of the inductor 10 are extended beyond the bottom exterior surface of the bottom magnetic core 12, best depicted by a side view of the inductor 10 as is shown in further detail at FIG. 1C. The extension may be included so that either passive or active components can be placed between the inductor 10 and the substrate or a lead frame to which the inductor 10 will be mounted. The part of the internal conductor 13 that extends beyond the bottom exterior surface creates terminals that are used to mount the structure of the inductor 10 to the substrate or lead frame.

Figure 2A:
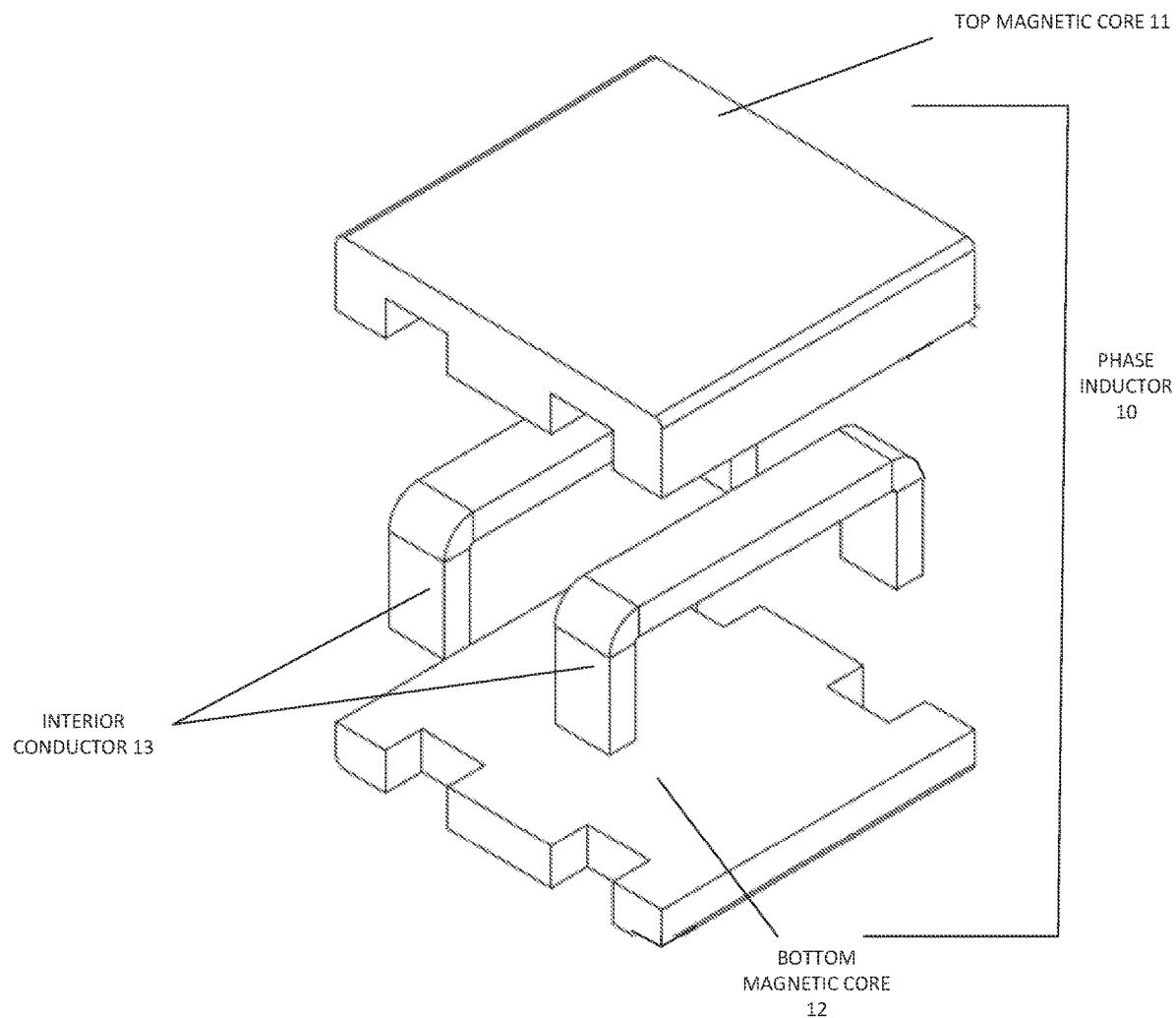
FIG. 2A is a perspective view of one embodiment of the present invention where the top magnetic core is an 'E' core and the bottom magnetic core is an 'I' core in accordance with some embodiments of the current disclosure.

FIG. 2A shows a perspective view of the front and back view of an embodiment of the inductor 10. In one embodiment, the overall geometric structure of the inductor is such that it appears as an E-I magnetic core configuration, where the top magnetic core 11 is an E configuration and the bottom magnetic core 12 is an I configuration.

The function of the inductor 10 created by the individual internal conductors 13 placed through each core opening can be altered to function as two separate non-coupled inductors with internal conductors 13 that can be used for each phase of the two-phase DC-DC converter output, or as a single coupled inductor with two internal conductors 13 that can function as separate phases of coupled inductor in a DC-DC converter. The inductor's 10 performance as a pair of uncoupled inductors or as a two-phase coupled inductor is caused by vertically oriented and horizontally oriented non-magnetic gaps placed in the center leg of the composite-magnetic E core.

Figure 2B:
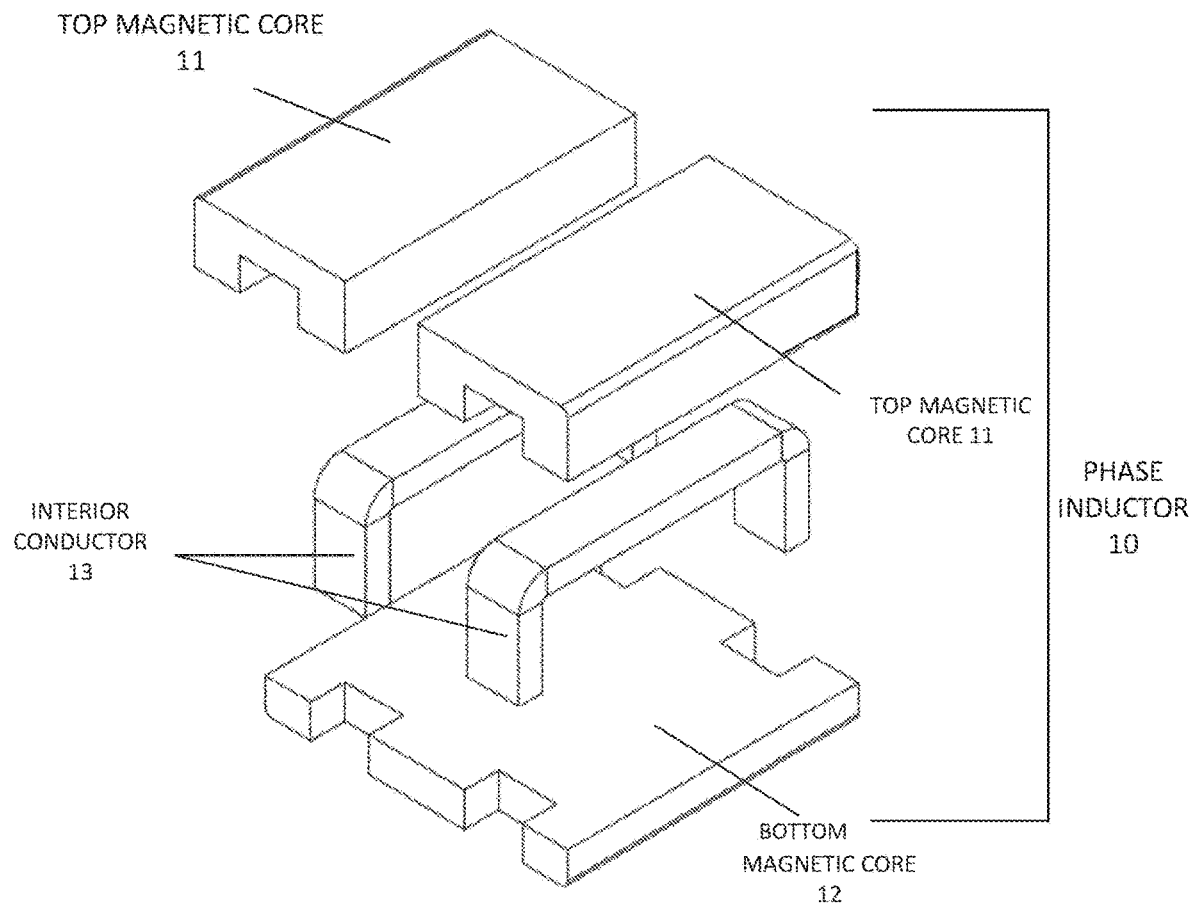
FIG. 2B is a perspective view of one embodiment of the present invention where the top magnetic core comprises of two 'U' cores and the bottom magnetic core is an 'I' core in accordance with some embodiments of the current disclosure.

FIG. 2B is a perspective view of one embodiment of the present invention, where a top magnetic core 11 is formed by two side-by-side U magnetic cores and when viewed externally, provide the appearance of an E core configuration. The bottom magnetic core 12 is one I magnetic core. The center leg of the composite-E core is formed by the two adjacent U cores. The vertically oriented nonmagnetic gaps between the adjacent exterior surfaces of the adjacent U cores determine the level of coupling between the two adjacent inductors.

Figure 2C:
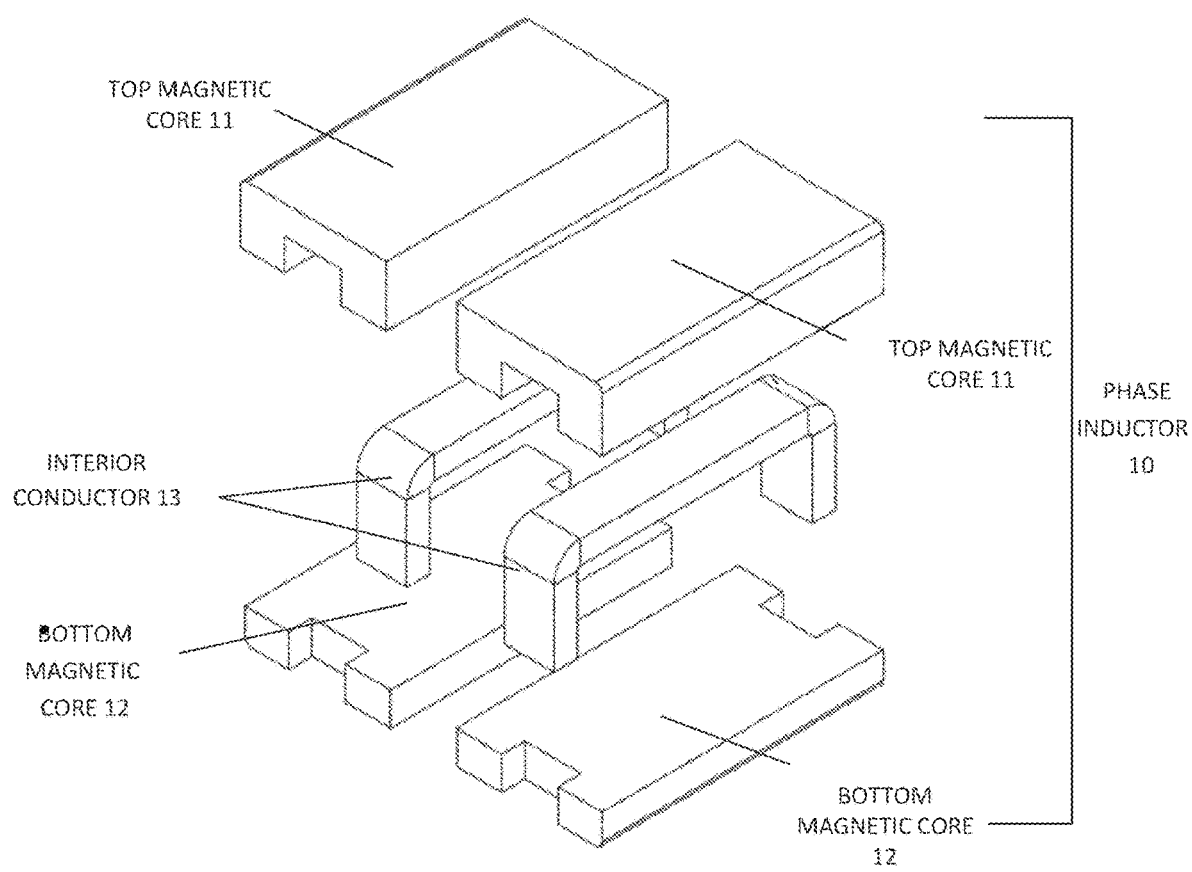
FIG. 2C is a perspective view of one embodiment of the present invention where the top magnetic core comprises of two 'U' cores and the bottom magnetic core comprises of two 'I' cores in accordance with some embodiments of the current disclosure.

FIG. 2C is a perspective view of one embodiment of the present invention where the top magnetic core 11 is formed by two side-by-side U magnetic cores, and the bottom magnetic core 12 is formed by two side-by-side I magnetic cores. Horizontally oriented nonmagnetic gaps between the interfaces of the magnetic U cores and the magnetic I cores are used to control the value of inductance and the saturation current capability of each inductor section.

In an embodiment, the top magnetic core 11 and the bottom magnetic core 12 are fabricated with a magnetic material such as chromium silicon iron oxide, aluminum silicon iron, molybdenum nickel, nickel iron, or manganese-zinc (MnZn) ferrite. The iron oxide composite magnetic material contains the magnetic field of the inductor 10 within the magnetic material, and prevents the magnetic field from propagating beyond the inductor 10 boundary. The DC resistivity of the magnetic core material is such that a non-insulated internal conductor 13 can be in contact with the top magnetic core 11 and the bottom magnetic core 12 without the consequence of different physically separated points of the conductor being electrically shorted through or by the electrical conductivity of the magnetic core. Typically, the values of the series inductance and the series resistance will be as if the conductor was separated from the magnetic core by insulation.

Figure 3A:
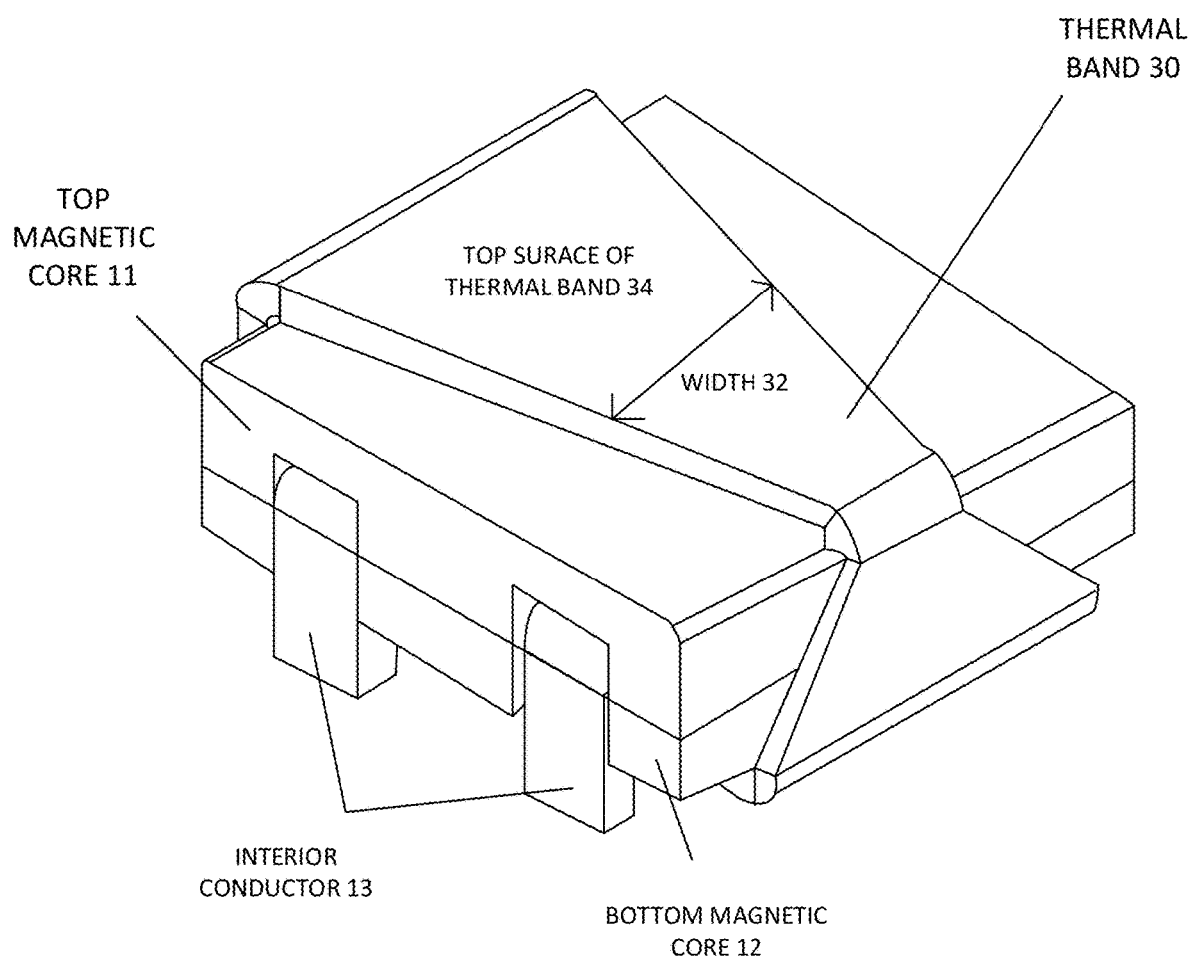
FIG. 3A illustrates an example of an inductor structure disposed in a band to distinguish the top surface of the exterior surface of the band and the width of the band, in accordance with some embodiments of the current disclosure.

FIG. 3A illustrates an example of an inductor structure disposed in a band to distinguish the top surface of thermal band 34 and the width 32 of the band 30 that is formed of a high thermally conductive material, in accordance with some embodiments of the disclosure. In some embodiments, the band 30 is formed of a high thermally conductive material such as, but not limited to, a formable metal such as copper, silver, gold, aluminum, steel, stainless steel, tungsten, or zinc. In some embodiments, the highly thermally conductive material can be a non-metal, including, but not limited to, aluminum nitride, graphite, silicon carbide, aluminum, tungsten, or graphite. In some embodiments, the high thermally conductive material may have a thermal conductance greater than the thermal conductivity of the inductor with values at least 100 watts per meter per kelvin (W/mK), and preferably greater than 200 W/mK.

The thermal band 30 of the inductor 10 may be coupled to and in contact with heat generating components that are positioned below the conductor. For example, the thermal band 30 of the inductor 10 may be in contact with one or more processors of a semiconductor device. The heat generated from the power loss of these heat generating components may then be transmitted through the contact points from the heat generating components to the thermal band 30, as will be described in further detail at FIG. 3C below.

In some embodiments, the width 32 of the band 30 can vary around the inductor structure. The minimum width 32 of the band on the bottom, left, right, and top surface of the inductor 10 may be as wide as necessary to make a proper thermal connection with the devices underneath. The maximum width 32 of the band 30 on the bottom surface of the inductor 10 may pass a spacing clearance determined by manufacturing tolerances so the maximum width 32 does not affect the conductive terminals 13. The maximum width 32 for the left, right, and top surface of the inductor 10 can be an overhang of surface of the inductor 10, in which the purpose is to maximize surface area.

In one embodiment, limiting nonmagnetic gaps in the pseudo-center leg of top magnetic core 11, the use of a magnetic material with a suitably high value of DC volume resistivity, and the extension of the internal conductor terminals that extend past the bottom surface of the bottom magnetic core 12 allow for the band 30 to be formed about the periphery of the inductor 10. The limitation of the nonmagnetic gaps to the pseudo-center leg of the composite inductor 10 eliminates the possibility of fringing losses associated with close physical proximity of a conductor to a nonmagnetic gap. The high volume DC resistivity of the magnetic material allows the top magnetic core 11 and bottom magnetic core 12 to be in physical contact with both internal conductor 13 turns and the band 30 without the consequence of circulating currents due to shorting of different potentials induced along the conductor materials. Finally, the extension of the terminals of the individual conductors past the bottom exterior surface of the bottom magnetic core 12 allows the terminals to be mountable to a substrate while a suitably thick band 30 encompasses the four exterior surfaces (bottom side, right side, left side and top side) of the inductor 10. The front side and back side of the top magnetic core 11 and the bottom magnetic core 12 are reserved for the input and output terminals and are not covered by the band 30.

In an embodiment, the nonmagnetic gaps may be limited to the pseudo-center leg of the top magnetic core 11. This will allow for the placement of the band 30 about the exterior surfaces of the inductor 10 without bridging any nonmagnetic, vertically oriented magnetic gaps that are used to control the amount of coupling between the two individual inductors of a two-inductor structure or the horizontally oriented gaps used to control the inductance and saturation current for each individual inductor of the inductor 10.

Figure 3B:
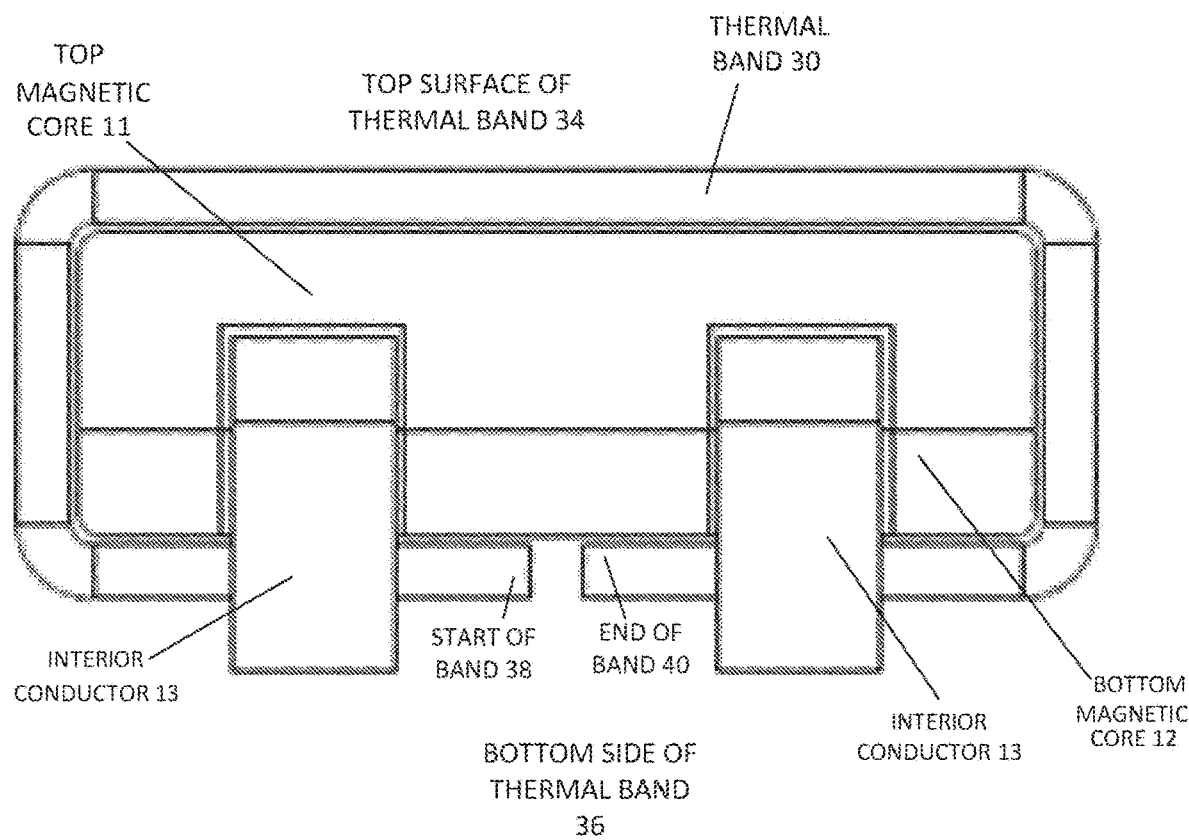
FIG. 3B depicts a front and back view of an example of an inductor structure disposed in a band in FIG. 3A to distinguish the top and bottom surface of the band, and to distinguish the start and end of the band, in accordance with some embodiments of the current disclosure.

FIG. 3B depicts a front and back view of an example of an inductor structure disposed in a band in FIG. 3A to distinguish the top surface of thermal band 34 and bottom surface of thermal band 36, and to distinguish the start of band 38 and end of band 40, in accordance with some embodiments of the current disclosure.

Figure 3C:
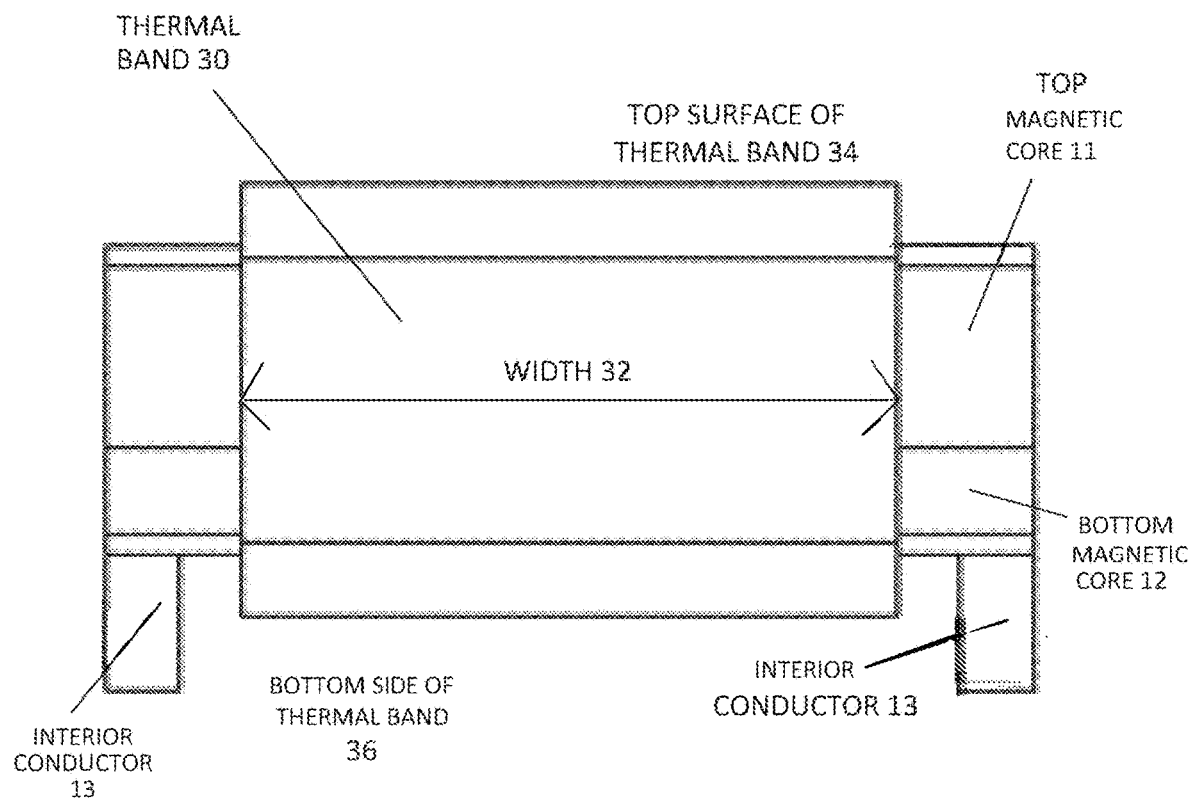
FIG. 3C depicts a side view of an example of an inductor structure in a band in FIG. 3A in accordance with some embodiments of the current disclosure.

FIG. 3C depicts a side view of an example of an inductor structure in a band in FIG. 3A in accordance with some embodiments of the current disclosure.

Figure 4:
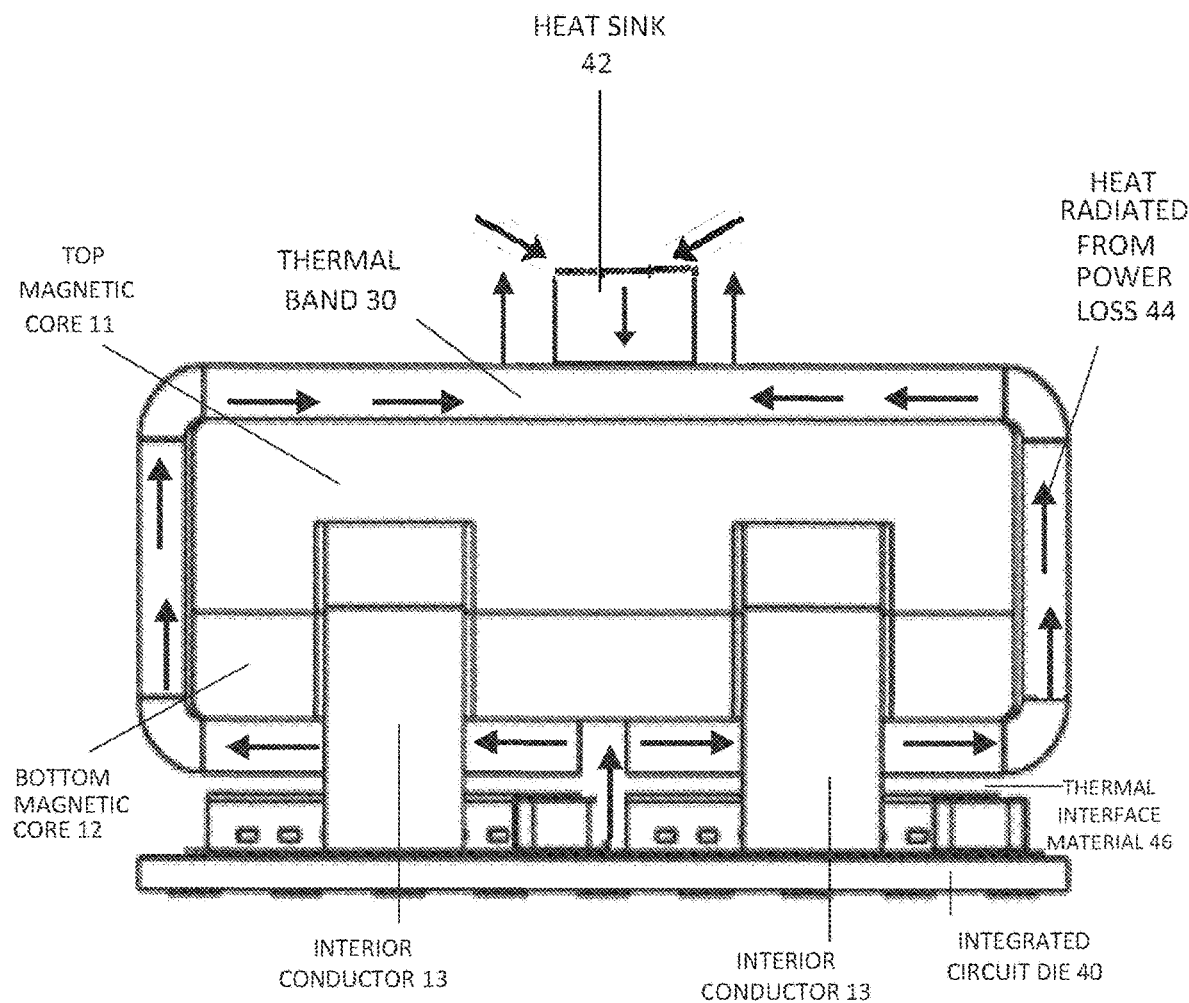
FIG. 4 is a perspective of an example inductor structure with two individual bands disposed around each individual inductor, in accordance with embodiments of the disclosure.

FIG. 4 illustrates the path of dispersion of heat 44 radiated from power loss of an integrated circuit (IC) around the inductor 10 through the band 30 to a heat sink 42. The copper band about the composite magnetic E-I core structure that was enabled by the specific construction features of the composite magnetic E-I core structure can be used to conduct heat 44 radiated from the power loss of components of the IC. The heat 44 is dissipated through the thermal conductive path formed by the band 30 to a heat sink 42 mounted to the top surface of the band 30 over the composite magnetic E-I core. Components with thermally significant power located between the inductor 10 and the device substrate and/or lead frame can be electrically attached to the substrate/headframe and thermally attached to the band 30. The heat 44 radiated from the power loss of the components under the inductor 10 is typically conducted through multiple layers of insulation and interconnects between the device's substrate and end application printed IC. This will create an alternate, more thermally conductive and continuous path to a heat sink 42 and is a more efficient mechanism to dissipate the heat than ground planes located in the printed circuit board below the device.

Figure 5:
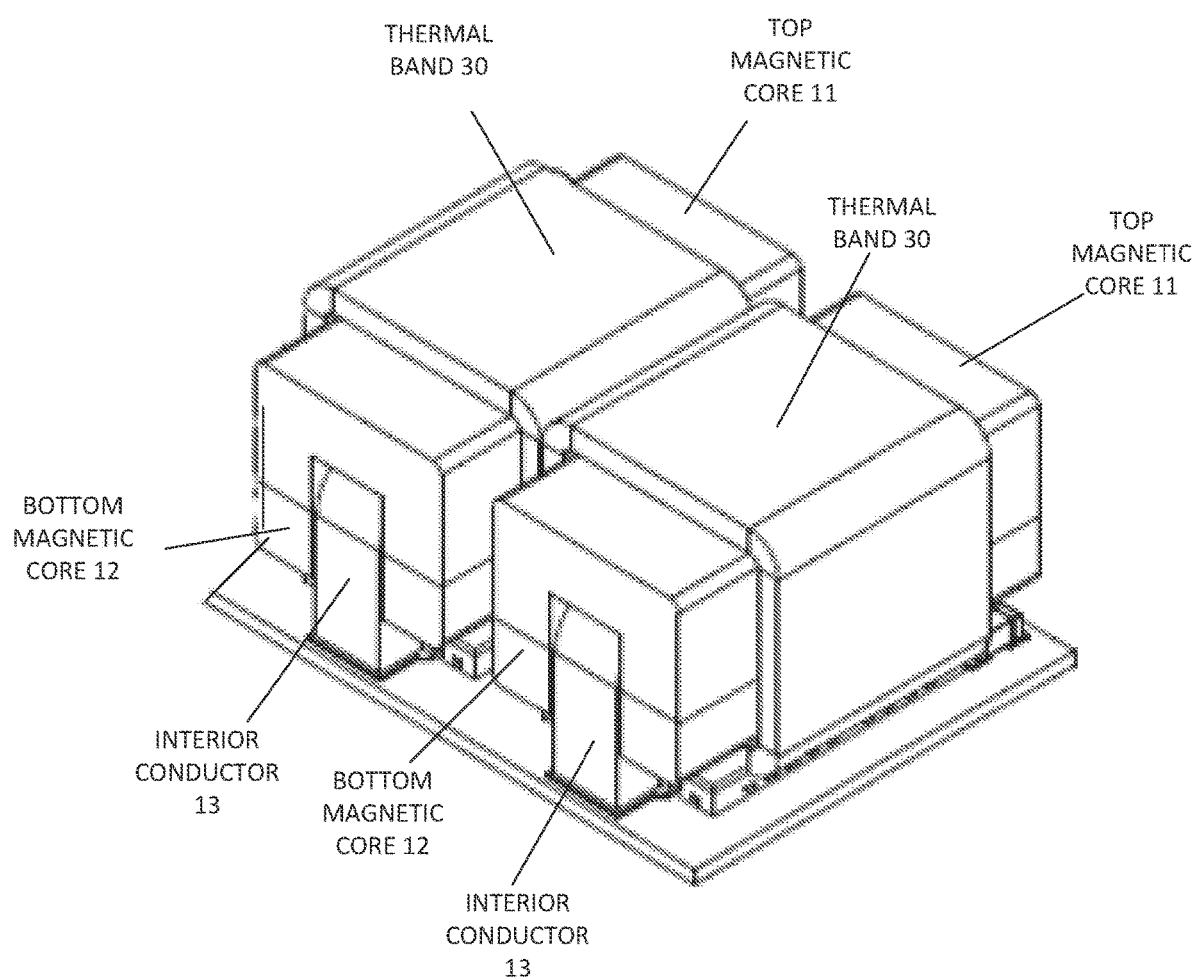
FIG. 5 illustrates an example of a path of dispersion of heat radiated from power loss of an integrated circuit (IC) around the inductor structure through the band to a heat sink, in accordance with embodiments of the disclosure.

FIG. 5 is perspective of an example of a two-inductor 10 with two individual bands 30 disposed around each individual inductor. In some embodiments, the inductor structure may include one or more additional individual inductors. Each individual inductor can have a respective band 30 disposed around it. The purpose of the band 30 is to cover the outermost exterior left, right, top, and bottom surfaces of the inductor 10. As long as the exterior surfaces are covered with the band 30, then the heat produced from the IC has a direct conductive thermal path to the top of the package. In some examples, the top of the package has a heat sink coupled to the top surface of the band 304.

Figure 6:
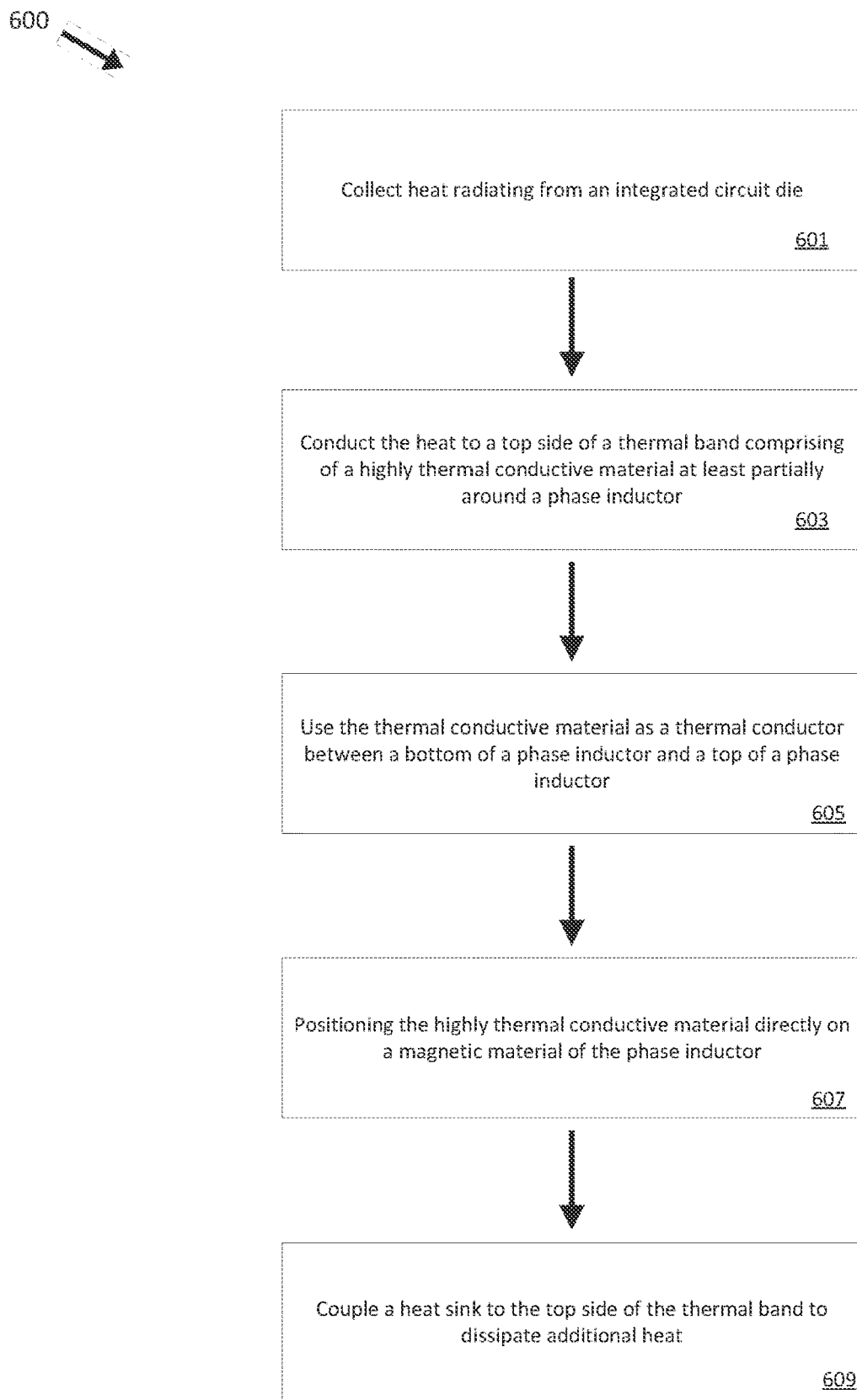
FIG. 6 is a flow diagram of a method to dissipate heat from the IC around the power module to the heat sink, in accordance with embodiments of the disclosure.

FIG. 6 is a flowchart illustrating of a method 600 to dissipate heat from the IC around the inductor 10 with a band 30 disposed around it to the heat sink. In some embodiments, method 600 may be performed at least in part by the inductor 10 and the band 30. Method 600 begins at block 602, where the heat radiating from power loss of the components on the IC chip under the inductor 10 disposed in the band 30. The band 30 can either be one band that is disposed around the exterior surfaces of the inductor 10, or the band 30 can be individual bands 30 that are disposed around each individual inductor in the inductor 10.

At block 604, the heat collected in block 602 is conducted up and around the inductor 10 through the band 30. The inductor 10 is mounted to the IC by the conductive clip terminals. The high thermally conductive material of the band is also thermally coupled to the IC below. In some examples, a thermal interface material 46 may be disposed between the IC and the band 30.

At block 606, the thermally conductive material of the band 30 is used as a thermal conductor for the bottom surface of the bottom magnetic core 12 and the top surface of the top magnetic core 11 of the inductor 10.

At block 608, the high thermally conductive material of the band 30 is placed directly on the exterior surface of the magnetic material of the top magnetic core 11 and the bottom magnetic core 12. Due to the elevated terminals, the band 30 can be made suitably thick so that the band can be used as a thermal conductor between bottom side of the inductor 10 and the top side of the inductor 10.

At block 610, in some embodiments, a heat sink 42 is coupled to the top surface of the band 30. In some embodiments, the heat sink 42 is a metal clip coupled to the top surface of the band. The metal clip may be formed copper and aluminum. In some embodiments, the heat sink may include passive heat sinks, active heat sinks, bonded heat sinks, or any other type of heat sink.

Figure 7:
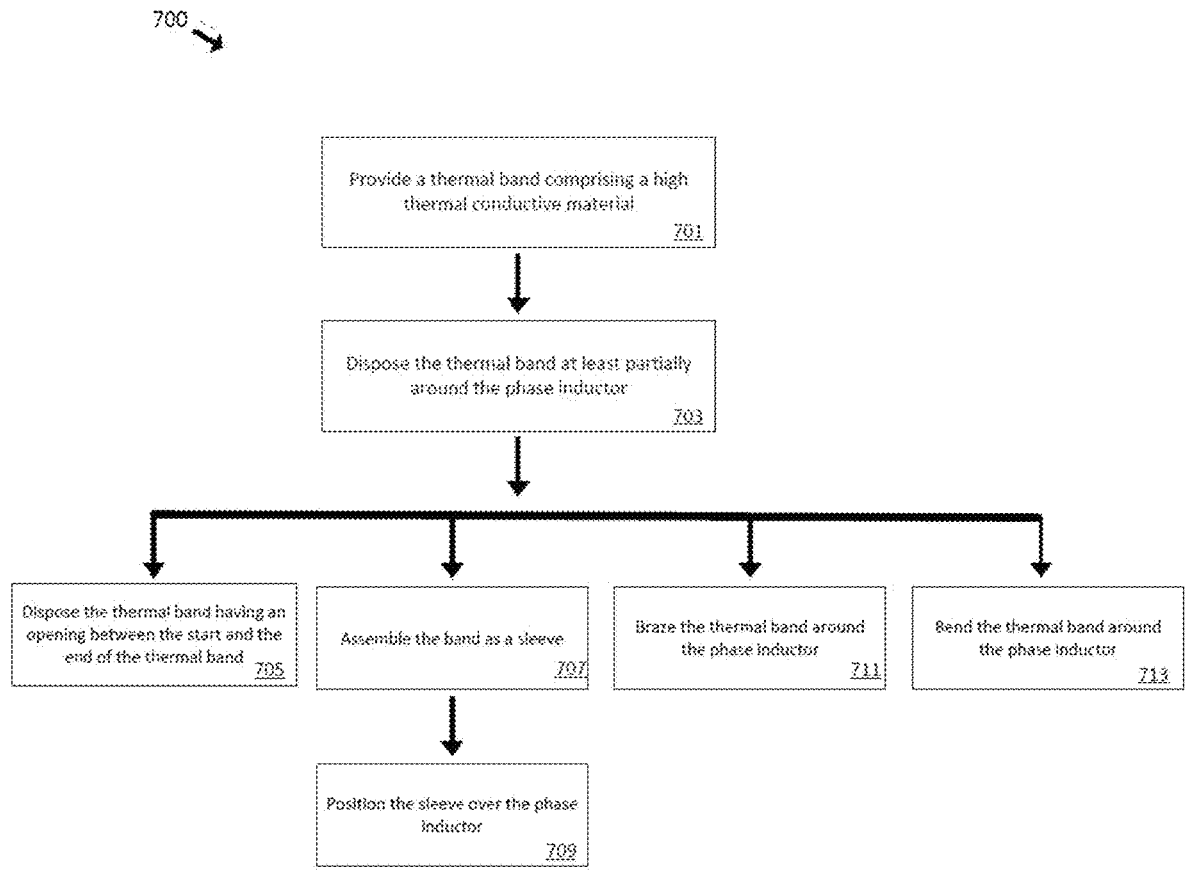
FIG. 7 is a flow diagram of a method of fabricating the power module, in accordance with some embodiments of the disclosure.

FIG. 7 is a flow diagram of a method of fabricating the band 30 and disposing it around the inductor 10. Method 700 begins at block 702, where a band 30 comprised of a high thermally conductive material is provided. In some embodiments, the band 30 is formed of a high thermally conductive material such as, but not limited to, copper, silver, gold, aluminum nitride, silicon carbide, aluminum, tungsten, or graphite.

At block 704, the provided band 30 is disposed at least partially around the inductor 10. In some embodiments, the width of the band 30 is uniform when disposed around inductor 10. In some embodiments, the width 32 of the band 30 varies such that it is not uniform when disposed around the inductor 10.

At block 706, the band 30 is disposed around the inductor 10. The start of the band 38 and the end of the band 40 may not touch on the bottom surface of the bottom magnetic core 12. The part of the exterior surface of the bottom magnetic core between the start of the band 38 and the end of the band 40 may be positioned directly over a heat producing component on the IC. In some embodiments, the heat producing component may be a field effect transistor (FET).

At block 708, the band 30 is assembled as a sleeve. In some embodiments, the band 30 includes one or more bands 30 for each individual inductor in the inductor 10.

At block 710, the band 30 that is assembled as a sleeve is slid over the inductor 10. In some embodiments, the band 30 includes one or more bands 30 that are assembled as a sleeve and slid over each individual inductor of the inductor 10.

At block 712, the band 30 is coupled to the inductor 10. In some embodiments the band is brazed to the inductor 10. In one example, the start of the band 38 and the end of the band 40 are connected together by a filler metal that is melted and flows between the two ends. The filler metal may have a lower melting point than the adjoining metal. The absence of the high thermally conductive material between the start of the band 38 and the end of the band 40 on the exterior surface of the bottom magnetic core 12 over the heat producing component does not eliminate the heat path to the top of the package. This is because the conductivity of the brazing metal is lower than the conductivity of the band 30. The heat will still be conducted to the brazing metal but will follow a path through the band 30 that is formed of a higher thermally conductive metal.

In some embodiments, the brazing metal may be, but is not limited to, aluminum-silicon, copper, copper-silver, copper-zinc, copper-tin, gold-silver, nickel alloy, silver, or other types of amorphous brazing foil.

At block 714, the band is bent around the inductor. The manufacturer may bend the band 30 according to manufacturing tolerances and specifications.

The preceding description sets forth numerous specific details such as examples of specific systems, components, methods, and so forth, in order to provide a thorough understanding of several examples in the present disclosure. It will be apparent to one skilled in the art, however, that at least some examples of the present disclosure may be practiced without these specific details. In other instances, well-known components or methods are not described in detail or are presented in simple block diagram form in order to avoid unnecessarily obscuring the present disclosure. Thus, the specific details set forth are merely exemplary. Particular examples may vary from these exemplary details and still be contemplated to be within the scope of the present disclosure.

Any reference throughout this specification to "one example" or "an example" means that a particular feature, structure, or characteristic described in connection with the examples are included in at least one example. Therefore, the appearances of the phrase "in one example" or "in an example" in various places throughout this specification are not necessarily all referring to the same example Although the operations of the methods herein are shown and described in a particular order, the order of the operations of each method may be altered so that certain operations may be performed in an inverse order or so that certain operation may be performed, at least in part, concurrently with other operations. Instructions or sub-operations of distinct operations may be performed in an intermittent or alternating manner.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Furthermore, the terms "first," "second," "third," "fourth," etc. as used herein are meant as labels to distinguish among different elements and may not necessarily have an ordinal meaning according to their numerical designation.

What is claimed is:

1. An apparatus comprising:
a band comprising a high thermally conductive material disposed at least partially around an inductor, wherein the high thermal conductive material has a thermal conductive value greater than the thermal conductivity of the inductor, wherein a minimum width of the band is the minimum width to allow a thermal connection with one or more terminals of an integrated circuit die.

2. The apparatus of claim 1, wherein the high thermally conductive material is a formable metal comprising copper, silver, gold, aluminum, steel, stainless steel, tungsten, or zinc.

3. The apparatus of claim 1, wherein the high thermally conductive material comprises a non-metal including aluminum nitride, or graphite.

4. The apparatus of claim 1, further comprising one or more additional band disposed around a corresponding one of one or more additional inductors.

5. The apparatus of claim 1, wherein a width of the band varies around the inductor.

6. The apparatus of claim 1, wherein the integrated circuit die comprises an integrated circuit in a package or multiple circuits in a package.

7. The apparatus of claim 1, wherein a maximum width of the band is an overhang of a width of the inductor.

8. The apparatus of claim 1, wherein the band completely surrounds the inductor.

9. The apparatus of claim 1, wherein the band makes direct contact with the inductor.

10. The apparatus of claim 1, wherein the band improves thermal performance, magnetic shielding performance, electrostatic shielding performance, or improves placement of the inductor as part of an assembly.

11. The apparatus of claim 1, wherein the high thermally conductive material has a thermal conductivity that is greater than 200 watts per meter per kelvin (W/mK).

12. The apparatus of claim 1, wherein the high thermally conductive material has a thermal conductivity that is greater than 100 watts per meter per kelvin (W/mK).

13. The apparatus of claim 1, wherein the band is electrically decoupled from the integrated circuit die.

* * * * *